United States Patent [19]

Back

[11] Patent Number: 4,462,678
[45] Date of Patent: Jul. 31, 1984

[54] DEVICE FOR FEEDING AND TRANSPORTING PRINTING FORMS

[75] Inventor: Günter Back, Diesenbergen, Fed. Rep. of Germany

[73] Assignee: Hoechst Aktiengesellschaft, Frankfurt am Main, Fed. Rep. of Germany

[21] Appl. No.: 382,288

[22] Filed: May 26, 1982

[30] Foreign Application Priority Data

Jun. 5, 1981 [DE] Fed. Rep. of Germany ....... 3122321

[51] Int. Cl.³ .......................................... G03G 15/00
[52] U.S. Cl. .................... 355/3 R; 355/3 SH; 355/14 SH; 271/264; 271/228; 271/273
[58] Field of Search ............... 271/240, 227, 228, 238, 271/264, 273, 274; 355/14 R, 14 SH, 3 R, 3, 72, 73, 74

[56] References Cited

U.S. PATENT DOCUMENTS

| | | |
|---|---|---|
| 2,681,618 | 6/1954 | Warme . |
| 4,006,984 | 2/1977 | Friese . |
| 4,212,419 | 7/1980 | Huber . |
| 4,402,592 | 9/1983 | Schön et al. ........................ 355/3 R |

FOREIGN PATENT DOCUMENTS

| | | |
|---|---|---|
| 2462216 | 5/1976 | Fed. Rep. of Germany . |
| 2844528 | 4/1979 | Fed. Rep. of Germany . |
| 1163747 | 9/1958 | France . |
| 642554 | of 0000 | United Kingdom . |
| 27358 | of 1914 | United Kingdom . |

OTHER PUBLICATIONS

European Search Report

*Primary Examiner*—J. V. Truhe
*Assistant Examiner*—David S. Warren
*Attorney, Agent, or Firm*—Schwartz, Jeffery, Schwaab, Mack, Blumenthal & Koch

[57] ABSTRACT

The invention relates to a device for feeding printing plates 33 and transporting them onto an exposure table 1, with the aid of rollers 10, 10', 10" ..., 11, which are arranged in pairs and are fastened, by means of blocks 5, 6 on two roller rails 4, 4'. The roller rails 4, 4' are located at both sides of the exposure table 1, in the transport direction. The transport rollers 10 which are positioned first in the transport direction of the printing plate 33 are installed on pivoting blocks 5, which are pivoted outwardly before the printing plate 33 is deposited and, after the printing plate 33 has been deposited, are swung into contact, in order to take over the roller-transport, together with the remaining rollers. As soon as the printing plate 33 has reached its exposure position, the roller rails 4, 4' are, in their entirety, swung away from the exposure table 1, parallel to themselves, thus enabling the printing plate 33 to be exposed out to its outer edge without hindrance.

11 Claims, 4 Drawing Figures

DEVICE FOR FEEDING AND TRANSPORTING PRINTING FORMS

BACKGROUND OF THE INVENTION

The present invention relates to a device for feeding and transporting printing forms which can be transported onto an exposure table with the aid of rollers. A device of this type has rollers which are located at the two lateral edges of the printing form, and those rollers positioned first, in the transport direction of the printing forms, can be pivoted outwardly.

The production of printing forms carrying lettering and images, for example printing plates which are immediately suitable for printing, is carried out by initially charging the printing plates electrostatically and then projecting an original, as an image, onto the individual printing plate. Following termination of this exposure process, the printing plate is developed with a developer, fixed and decoated, after which the plate is ready for the printing operation.

A unit for the electro-photographic production of printing forms is known from U.S. Pat. No. 4,006,984. In this unit the individual printing form is lifted from a stack in a plate magazine by means of a transport device which transports the printing forms to an exposure stage, wherein the transport device comprises a transport carriage having a suction arrangement operated by a pressure lower than atmospheric pressure. In order to combine the charging-up of the individual printing form with its transport to the exposure stage, so as to save time, a corona-type charging station for electrostatically charging the printing plates is located at the front side of the transport carriage and extends at right angles to the direction of movement of the transport carriage. The transport carriage runs on two guide rails, and can be driven by a motor which is located on the upper side, this motor engaging, via a toothed wheel, a toothed rack drive arranged parallel to the direction of movement of the transport carriage. The transport carriage possesses, on the underside, a vacuum plate which is connected, via a number of holes, to a vacuum pump. On placing the vacuum plate of the transport carriage onto the upper side of the uppermost printing plate in the plate magazine, a pressure lower than atmospheric pressure is produced, whereby this printing plate is sucked against the vacuum plate. The transport carriage is thereafter driven, with the aid of the motor, toward the exposure stage where, as soon as it has reached its position above the exposure stage, it is lowered onto the stage and the vacuum is removed from the vacuum plate, so that the printing plate is released and is deposited on the exposure stage. The latter likewise contains a vacuum plate, to which a pressure lower than atmospheric pressure is applied, so that the printing plate is firmly pressed against the exposure stage during the exposure process.

In this known unit, that side of the printing plate which is coated with the photoconductor is touched by suction arrangements as the individual printing plate is lifted from the stack, and while these suction arrangements certainly enable the printing plate to be transported significantly more gently, compared to rollers or belts which are guided over the coated side of the printing plate in the case of other known units, the occurrence of mechanical or physical defects on the finished, developed printing plate, caused by the suction arrangements, cannot, however, be completely excluded.

A transport station for printing plates has been disclosed in U.S. Pat. No. 4,149,798.

This transport station possesses a stack region, in which a stock of printing plates is located, each printing plate being covered by a sheet of paper. A paper-dump facility is provided for the sheets of paper which are present between each two plates. The printing plates are transported from the stack region to a conveyor belt by means of a control mechanism which possesses a number of suction cups. The control mechanism is pivotably attached to a guide rod which is connected via gearing to a motor, so that this rod can execute a lateral sliding movement, forwardly and backwardly. Suction is applied to the uppermost printing plate from four or more suction cups of the control mechanism, after which the control mechanism pivots forwardly, and, at the same time, the guide rod is mechanically moved toward the conveyor belt. When the vacuum in the suction cups is removed, the control mechanism lowers itself and deposits the printing plate on the conveyor belt. A second control mechanism, above the sheet of paper, takes hold of the sheet, lifts it off and conveys it to the paper-dump facility.

The conveyor belt transports the printing plate onto an exposure stage which contains a number of holes in its surface and forms a chamber which is connected, via a suction line, to a vacuum pump. After the printing plate has been brought into the correct position on the surface of the exposure stage, it is held firmly on the latter by the generation of a vacuum. The exposure of the printing plate is effected with the aid of an exposure system.

The lifting of the uppermost printing plate from the stack is effected in the same manner as in the state of the art previously mentioned, wherein the photoconductive layer of the printing plate is touched by suction arrangements, and this process can lead to mechanical or physical defects on the finished printing plate.

In order not to mechanically touch the photoconductive layer of the printing plate during transport from a plate magazine to an exposure table, U.S. Ser. No. 250,124 (filed Apr. 2, 1981) proposes that a pivotable lifting cylinder be equipped with a piston rod which can be extended from, and be retracted into, the lifting cylinder, this piston rod carrying a dish-shaped plate for picking up, by suction, the uppermost printing plate of the stack, and for depositing the plate, and that the lifting cylinder be swung, about a rotation point, between a position at which the printing plate is received and a position at which it is deposited.

In U.S. Ser. No. 250,126 (filed Apr. 2, 1981) the object is achieved of transferring the printing plate, which has been lowered from above in a circular arc onto a supporting surface and of which the photoconductively coated side is facing upwardly, to a device for onward transport. This device is equipped with rollers; however the printing plate does not come to rest on the rollers as it is lowered, and the photoconductive layer of the printing plate does not come into contact with the rollers.

The proposed solution is that a pivotable lifting cylinder removes the printing form, which is configured as a printing plate, from a magazine and, executing a circular arc, deposits the printing form, by its front portion, onto a suction plate of the exposure table. Furthermore, a row of transport rollers and drive rollers is located, in each case, parallel to the two lateral edges of the printing plate, in the transport direction, and the transport rollers which are positioned first, in the transport direction of the printing plate, can be pivoted outwardly, out of the rows, in order to enable the front portion of the printing plates to be deposited, without jamming, onto the suction plate of the exposure table. After the printing plate has been deposited on the exposure table, the two mutually parallel roller rails with the transport rollers and drive rollers rest against the lateral edges of the printing plate and center the plate during the exposure. Since the rollers have a definite groove-depth, they overhang by this groove-depth at the edge or at the lateral edges of the printing plate, and project into its interior, thus making exposure of the printing plate all the way up to the edge impossible.

SUMMARY OF THE INVENTION

It is one object of the present invention to provide an improved device for feeding and transporting printing forms, of the type initially described.

It is a further object of the invention to provide a device of this type which is improved so that exposure is possible over the entire width of a printing form, all the way up to the outer edges.

In accomplishing the foregoing objects, there has been provided according to the present invention a device for feeding and transporting printing forms onto an exposure table, comprising a plurality of transport rollers located on each side of the exposure table for gripping the lateral edges of the printing forms, the transport rollers on each side being spaced apart in the direction of printing form transport to provide a first transport roller on each side and at least one subsequent transport roller on each side; means for selectively pivoting the first transport rollers outwardly from the edges of the printing form in response to feeding the leading edge of a printing form onto the exposure table, whereby jamming of the printing form against the first transport rollers is prevented; two rail members, one movably positioned on each side of the exposure table and extending parallel to each other in the direction of printing form transport, wherein the transport rollers are mounted on the rail members; and means, responsive to positioning of a printing form in an exposure position on the exposure table, for shifting the rail members outwardly in a direction perpendicular to the lateral edges of the printing form to move the transport rollers into positions spaced away from the lateral edges of the printing form. Preferably, the means for shifting the rail members comprises two pneumatic lifting cylinders located beneath the exposure table and a rotary lever linkage system linking each cylinder to each of the rail members.

Further objects, features and advantages of the present invention will become apparent from the detailed description of a preferred embodiment which follows when considered together with the attached sheets of drawing.

DETAILED DESCRIPTION OF PREFERRED EMBODIMENTS

Figure 1:
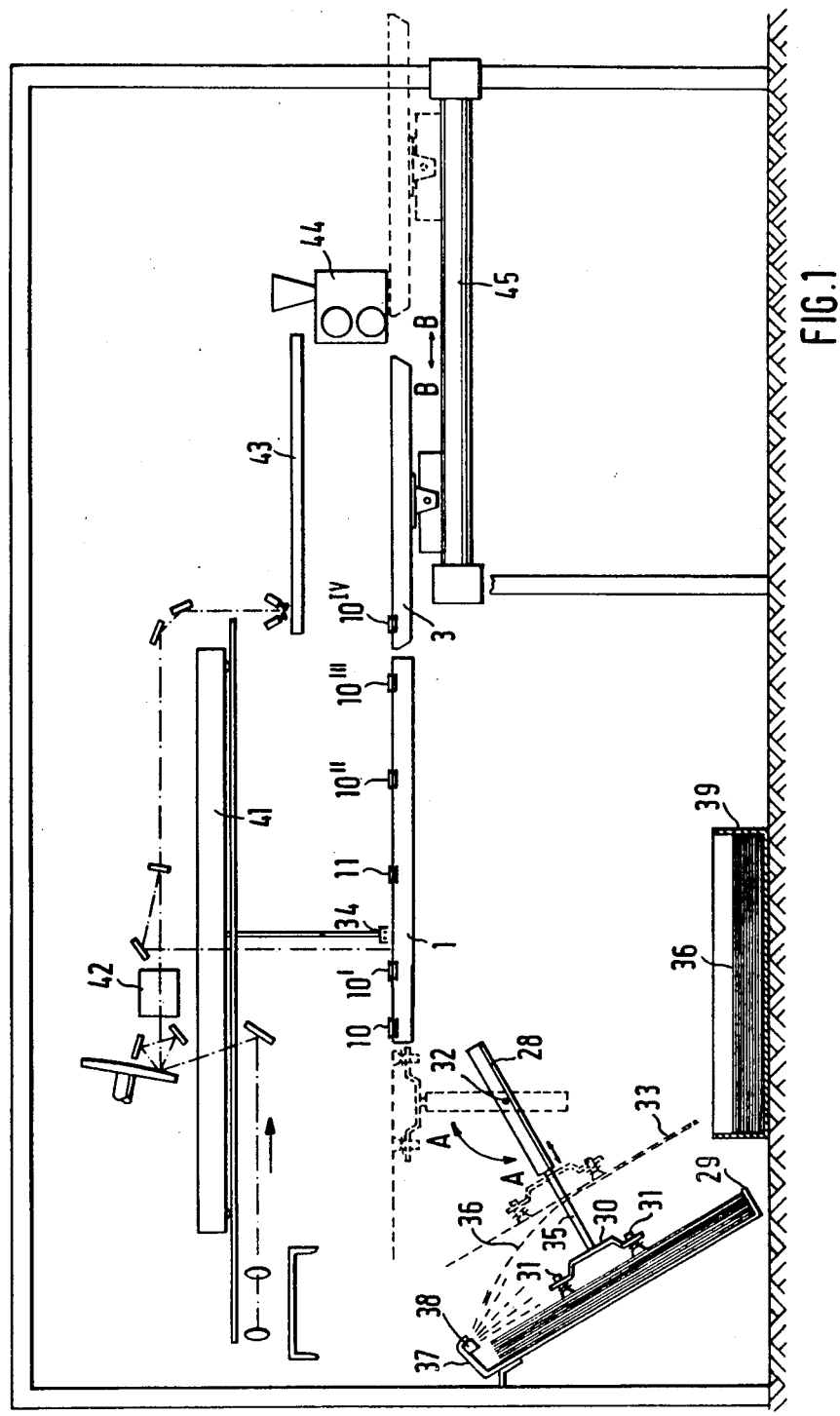
FIG. 1 is a diagrammatic representation of various processing stations of an apparatus for the reproduction of an original on the photoconducting surface of a printing form.

According to the invention, the rollers are rotatably mounted on blocks which are fastened on two roller rails which are parallel, one to the other, and are movable, and the roller rails can be shifted outwardly, perpendicularly to the lateral edges of the printing form, into a position parallel to the lateral edges.

By means of the invention, the advantage is obtained that printing forms of different widths can be exposed right up to the edge, so that optimum material utilization results. Furthermore, it is possible to produce printing forms even from large-format originals, these printing forms being built up from two or more printing forms of conventional formats which, after the individual printing forms have been exposed, can be joined together for the printing operation, without an intruding edge.

In the text which follows, the invention is described in more detail with reference to an illustrative embodiment which is represented in the drawings.

Various processing stations of an apparatus for the reproduction of an original on the surface of a printing form are represented diagrammatically in FIG. 1. As the printing form, a printing plate is preferred which is composed of a metal carrier onto which a photoconductive layer has been coated. It is equally possible to use, as the printing form, photoconductive coated papers, plastic films and similar materials. In the description, reference will continue to be made only to printing plates, but this fact does not exclude other types of printing forms.

A transport station for printing plates 33, which are stored in a magazine 29, comprises a pivotable lifting cylinder 28 with a piston rod 35 which can be extended from and retracted into the lifting cylinder. The printing plates 33 are stacked in the magazine 29, in a manner such that each individual printing plate within the stack comes to lie with its photoconductive coated side facing downwardly.

At its end projecting from the lifting cylinder 28, the piston rod 35 carries a dish-shaped plate 30, to which a plurality of suction elements 31 are fastened. The suction elements 31 are surrounded by springs which are located between the inner side of the plate 30 and the suction cups of the suction elements 31.

The lifting cylinder 28 can be swung from an inclined position into a vertical position, about a rotation point 32, as indicated by the double arrow A—A. In its receiving position, the lifting cylinder 28 can pivot about the rotation point 32 so that it is pointed perpendicularly to the uncoated side of the uppermost printing plate. As soon as the suction elements 31 are placed on the uppermost printing plate, by extending the piston rod 35, a pressure lower than atmospheric pressure is applied to them, and the piston rod 35 is partially retracted into the lifting cylinder until the printing plate 33, which is picked up by the suction elements, assumes the position represented in the drawing by a broken line.

An air nozzle 38, on an angled supporting arm 37, is provided at the upper end of the magazine 29, so that an airflow from this nozzle is directed almost tangentially onto the underside of the printing plate 33 which has been lifted from the stack. The airflow from the air nozzle 38, directed against the printing plate 33 which has been lifted from the stack, detaches a cover sheet 36, made of paper, plastic, foil, or the like. This sheet protects the coated side of the printing plate from damage. The sheet 36 is blown by the airflow into a collecting trough 39, located beneath the exposure table 1.

Figure 2:
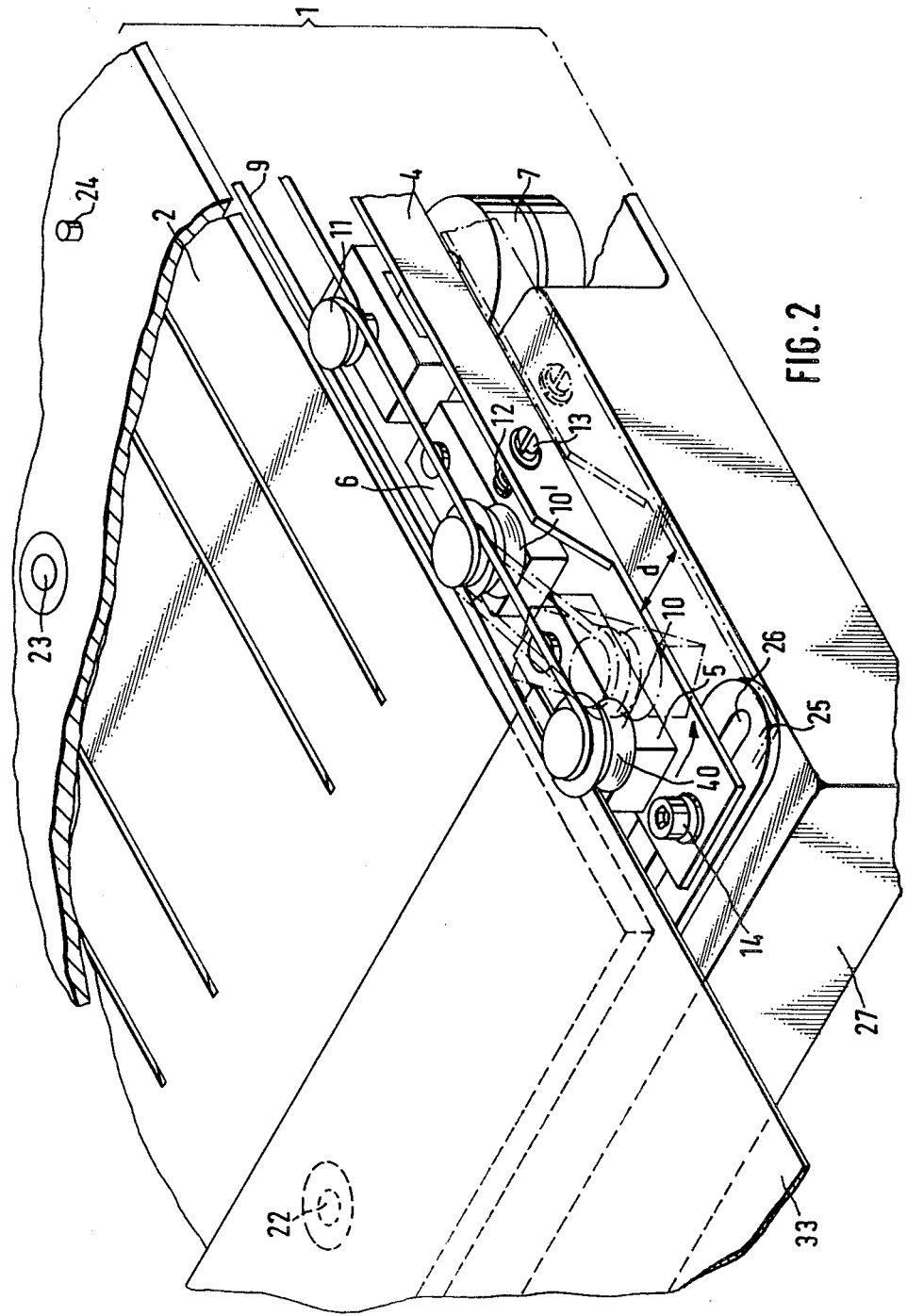
FIG. 2 is a perspective partial view of the exposure table with the roller rails resting against the edge of the printing form, and with the roller rails shown in phantom lines removed to a distance of "d" from the edge of the printing form.

The lifting cylinder 28 is then pivoted, about the rotation point 32, into its vertical position, so that the printing plate 33 executes a pivoting movement in the form of a circular arc, and is deposited from above with its front portion onto the suction plate 2 of the exposure table 1, as shown in FIG. 2.

A row of rollers is located at each of the two sides of the exposure table. In a row of rollers, located one behind another, the first two rollers are transport rollers 10, 10′, the next roller thereafter is a drive roller 11, which is then followed again by transport rollers 10″, 10‴, 10$^{IV}$, as shown in diagrammatic view in FIG. 1.

For the sake of better clarity, only one row of transport rollers and drive rollers is shown, in each case, in FIG. 2. It is self-evident that the row of rollers which is not shown is assembled analogously to the row which is illustrated.

The exposure table 1 comprises the suction plate 2, onto which the printing plate 33 is placed, by the lifting cylinder 28, in a manner such that the front edge of the plate comes to rest between the first transport roller 10 and the second transport roller 10′. As already mentioned previously, the transport rollers are arranged, as are the drive rollers, in pairs, on either side of the suction plate 2. When reference is made, in the description, to a transport roller or, as the case may be, to a drive roller, the said roller represents, in each case, a pair of rollers. The transport rollers 10, 10′, 10″ . . . and the drive roller 11 of a row are rotatably mounted on roller blocks which are fastened on a roller rail 4 or 4′ (see FIG. 3). Of these roller blocks, those positioned first, in the transport direction, are designed as pivoting blocks 5, while the remaining roller blocks 6 are arranged to be non-pivotable, and to be capable only of shifting laterally and/or to be stationary. The arrangement of the transport rollers shown by broken lines in FIG. 2 is that in which those transport rollers 10 positioned first, in the transport direction of the printing plate 33, are pivoted outwardly from each of the two rows of transport rollers in order to enable the front portion of the printing plate 33 to be deposited onto the suction plate 2 of the exposure table 1 without jamming. In FIG. 2, the pivoted-in position of the transport roller 10 is represented by means of continuous lines.

When the printing plate 33 is deposited, a solenoid, not illustrated, is triggered and switched by means of a front signal-transmitter 22, which is a switch or a proximity-type triggering device. The solenoid is fastened beneath the suction plate 2 or beneath the exposure table 1, and is connected to the pivoting blocks 5 via a lever system which is likewise not illustrated.

Each transport roller 10, 10′, 10″ . . . possesses a groove 40, in which the lateral edges of the printing plate 33 are guided during transport. As soon as the pivoting blocks 5 have pivoted into contact with the printing plate 33, the rotating transport rollers 10 grip the printing plate 33 and convey the whole of the plate onto the suction plate 2 of the exposure table 1. The drive of the transport rollers is effected, in each case, via one drive roller 11 in each row of transport rollers and, in particular, with the aid of a drive motor 7 which is fastened to the roller rail 4 or 4′, and which drives the drive roller 11. The two drive motors 7 in the two rows of rollers are designed as synchronous motors, thus guaranteeing continuous synchronization of these drive motors and of the drive rollers.

Transmission O-rings 9 lead from each drive roller 11 to the adjacent transport rollers 10′, 10″. The transport roller 10″ is likewise connected to the following roller 10‴, by means of a transmission O-ring, while the transport roller 10′ is connected to the first transport roller 10, on the pivoting block 5, via a transmission O-ring.

The roller blocks 6 of the transport rollers 10′, 10″, 10‴ . . . can be shifted at right angles to the transport direction of the printing plate 33, by means of adjusting screws 13 which are led through the vertical leg of the roller rail 4 and engage with the associated roller blocks 6. In this arrangement, the adjusting screw 13 is surrounded by a compression spring 12 which rests against the inner wall of the vertical leg of the roller rail 4 and against the roller block 6. By this means, it is ensured that the individual roller blocks 6 can, by means of the compression spring 12, yield laterally during the transport process, so that even slight misalignments or lopsided positions of the printing plate 33 during transport can be compensated by means of the resilient mounting of the roller blocks. Either all the roller blocks 6 of the two rows of transport rollers can be equipped with adjusting screws 13, or only one of the rows, while the other row of transport rollers is fastened at fixed positions on the roller rail.

The printing plate 33 is transported forward on the suction plate 2 until it rests against a stop 24 which can be retracted into the suction plate 2. During the transport of the printing plate 33, the first transport roller 10 is, of course, pivoted in, and rests against the lateral edge of the printing plate 33. As soon as the printing plate is positioned by means of the stop 24, a pressure lower than atmospheric pressure is applied to the suction plate 2, whereby the printing plate 33 is firmly held in its exposure position. Simultaneously with the positioning of the printing plate 33 by the stop 24, the front edge of the printing plate 33 actuates a signal transmitter 23 in the plane of the exposure table 1, this transmitter being, for example, a switch or a proximity-type triggering device. The signal transmitter 23 controls two or more lifting cylinders 8, which are located beneath the suction plate 2 of the exposure table 1 and are connected, in each case, via a rotary lever system 16, 18, 21, 21′, 48, 50 (FIG. 3), to each of the roller rails 4, 4′. As will be explained in greater detail later, the lifting cylinders twist the rotary lever system in a circular arc, these levers, in their turn, shifting the roller rails 4, 4′ outwardly, perpendicularly to the lateral edges of the printing plate 33, into a position parallel to the lateral edges. The roller rails 4, 4′ are thereby pivoted away from the lateral edges, by a distance "d" of up to approximately 15 mm, so that exposure right up to the outer edges of the printing plate 33 is possible.

As shown in FIG. 1, an exposure carriage 41, which can be moved horizontally and carries optical elements 42 for scanning an original 43 and for exposing the printing plate 33, is located above the exposure table 1.

Since these processing stations involve known devices, they are not described in greater detail.

A corona device 34 is fastened to the underside of the exposure carriage 41, this corona device charging the printing plate 33 while the exposure carriage 41 is moved horizontally, the printing plate then being exposed. After the printing plate 33 has been exposed, the stop 24 is retracted, the roller rails 4, 4' are pivoted in, to contact the lateral edges of the printing plate 33, and the latter is transported onwardly, by means of the transport rollers 10, 10', 10'' . . . onto a developing table 3, which is connected to a drive shaft 45, located underneath the table, along which shaft the table can be displaced horizontally, backwardly and forwardly, in the direction of the double arrow B—B. A developing device 44 is located above the developing table 3, this device applying a coating of developer, composed of a mixture of carrier particles and toner, from above by means of a magnetic brush to the surface of the printing plate 33, while the latter is guided past, beneath the developing device 44.

The low pressure at the suction plate 2 is removed during the onward transport of the printing plate 33. As soon as the rear edge of the printing plate 33 clears the signal transmitter 23, the latter triggers and energizes the mechanism for shifting the first transport roller 10, this mechanism not being illustrated, so that the pivoting blocks of the first transport rollers 10 pivot outwardly into the opening position. In this position, it is then possible to feed in a new printing plate 33 without difficulty, to grip the plate by means of the grooves in the transport rollers, and then to transport the plate further.

Two guide parts are provided on the upper side of a suction-plate support 27 of the exposure table 1, of which only the front guide part 25 is illustrated in FIG. 2, this part being arranged at right angles to the transport direction of the printing plate 33.

The second guide part, not shown, extends parallel to the first guide part, near the rear edge of the suction-plate support 27. Each guide part possesses a slot 26. The roller rails 4, 4' rest on the guide parts 25, and a guide pin 14 passes through them, at the front end and at the rear end, in each case, this pin engaging with the slots 26 in the guide parts 25. It is thereby possible to shift the roller rails 4, 4' along the guide parts 25 at right angles to the transport direction of the printing plate 33.

In the text which follows, the mechanism for shifting the roller rails 4, 4', and its arrangement beneath the suction-plate 2, on the suction-plate support 27 of the exposure table 1, are described with reference to FIGS. 3 and 4. In the plan views of FIGS. 3 and 4, the suction plate has been removed from the exposure table 1.

Two lifting cylinders 8 are installed in a retaining device 15 on the stationary suction-plate support 27, for example a casting. A piston rod 17 of the lifting cylinder is rotatably connected to a pivoting link 18, by means of a connecting piece 16. This pivoting link 18 possesses two coupling points 19, 20 at each of which one end of pivoting levers 21 and 21' is rotatably coupled. The pivoting link 18 is designed as a straight-line link and is guided at its mid-point in a central sleeve 46, which is installed on a central fixture 47. The other end of each pivoting lever 21, 21' is fastened to an associated clamping piece 50. Rods 48 lead from the clamping pieces 50, via connecting links 49, to the roller rails 4, 4'. The rods 48 can be shifted inside the clamping pieces 50, by a predetermined amount, thus enabling the distance between the roller rails 4, 4' to be adjusted to printing-plate widths in the range from 300–500 mm.

Each rotary lever system which is connected to a lifting cylinder 8 comprises the connecting piece 16, which is connected to the piston rod 17 of the lifting cylinder 8, and, furthermore, the pivoting link 18 with the two connecting points 19, 20, the two pivoting levers 21, 21' with the associated clamping pieces 50 and the rods 48, which are connected to the roller rails 4, 4' via the connecting links 49. Each pivoting lever 21, 21' possesses two parallel straight-line sections 58, 58', which are offset with respect to each other by the length of a connecting section 54 or, respectively, 54'. The connecting section 54 or 54' is joined to the straight-line sections 58, 58' in an arcuate manner. A return spring 51 brings the roller rail 4, 4' back into its starting position and is fastened at one end to an attachment point 55 on the one pivoting lever 21', and is fastened at the other end to a further attachment point 56 on the clamping piece 50 of the other pivoting lever 21. In the rest position of the shift mechanism, the roller rails 4, 4' rest against the lateral edges of the printing plate 33. As described previously, the printing plate 33 is transported by means of the rollers of the rails 4, 4', located in the rest position, onto the suction plate 2 of the exposure table 1, up to the stop 24, and the plate is held in this position by suction. The two lifting cylinders 8 are connected to each other via a pressure line 53, in which a magnetic valve 52 is located. The admission of pressure to the two lifting cylinders 8 is controlled by the magnetic valve 52, which is triggered by signals from the signal transmitter 23. As soon as compressed air is admitted to the two lifting cylinders 8, the piston rods 17 move and cause the pivoting links 18 to swing about the central sleeves 46. As can be seen from FIG. 3, the connecting points 19, 20 of the pivoting links 18 are then swung, from their positions C and D, into the positions C' and D', or in the opposite direction. This movement causes the two pivoting levers 21, 21' to be moved outwardly, that is to say, both move away from the center, and by means of the rods 48 and the connecting links 49, push the roller rails 4, 4' away from the lateral edges of the printing plate 33.

The printing plate 33 then rests on the exposure table 1, unencumbered and held by suction, and the exposure process can start.

After termination of the exposure process, the magnetic valve 52 shuts off the supply of compressed air in the pressure line 53 to the lifting cylinders 8, and the return springs 51 bring the roller rails 4, 4' back into their starting positions. At the same time, the rollers 10, 10', 10'' . . . are driven by the drive rollers 11 and the exposed printing plate 33 is transported to the developing device 44. The first transport rollers 10 of the roller rails 4, 4' are folded outwardly by means of the pivoting blocks 5, thus enabling a new, unexposed printing plate 33 to be received while the exposed printing plate 33 is still being transported to the developing device 44.

Figure 3:
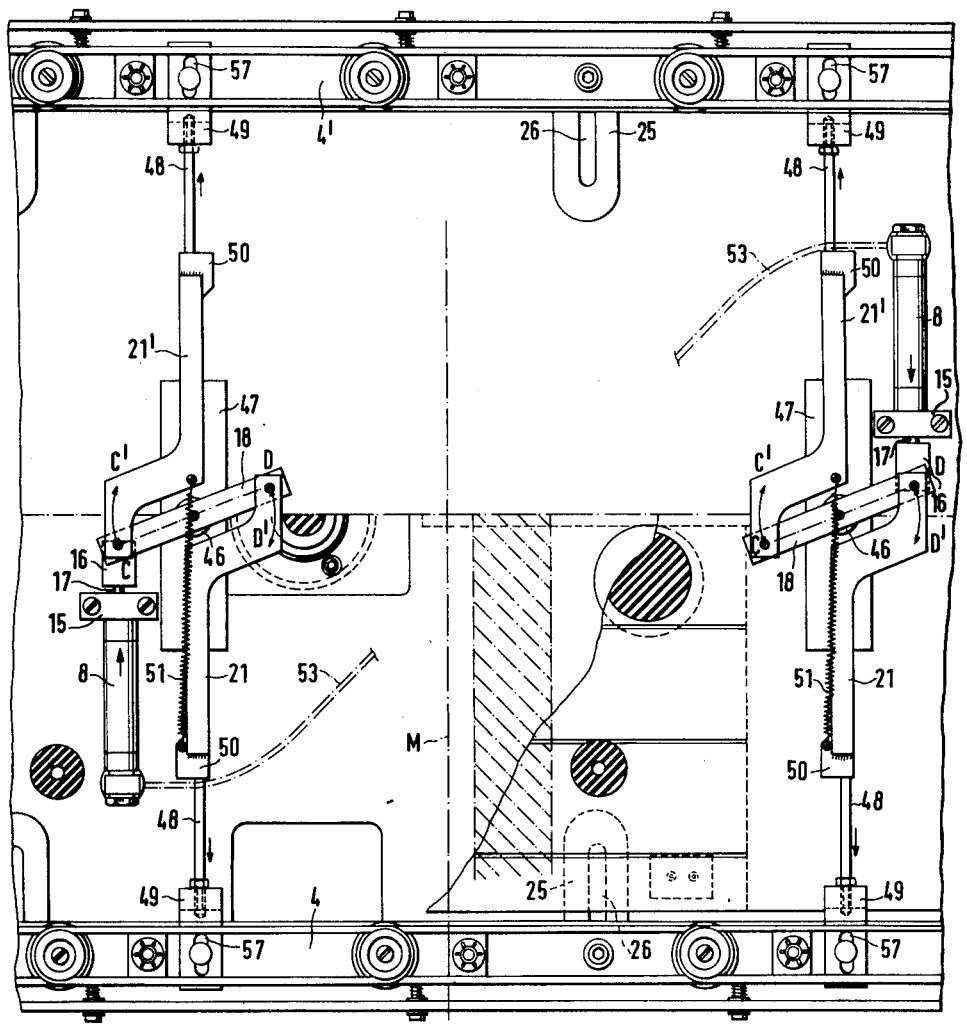
FIG. 3 is a plan view of the mechanism for shifting the roller rails, with the suction plate of the exposure table removed.
Figure 4:
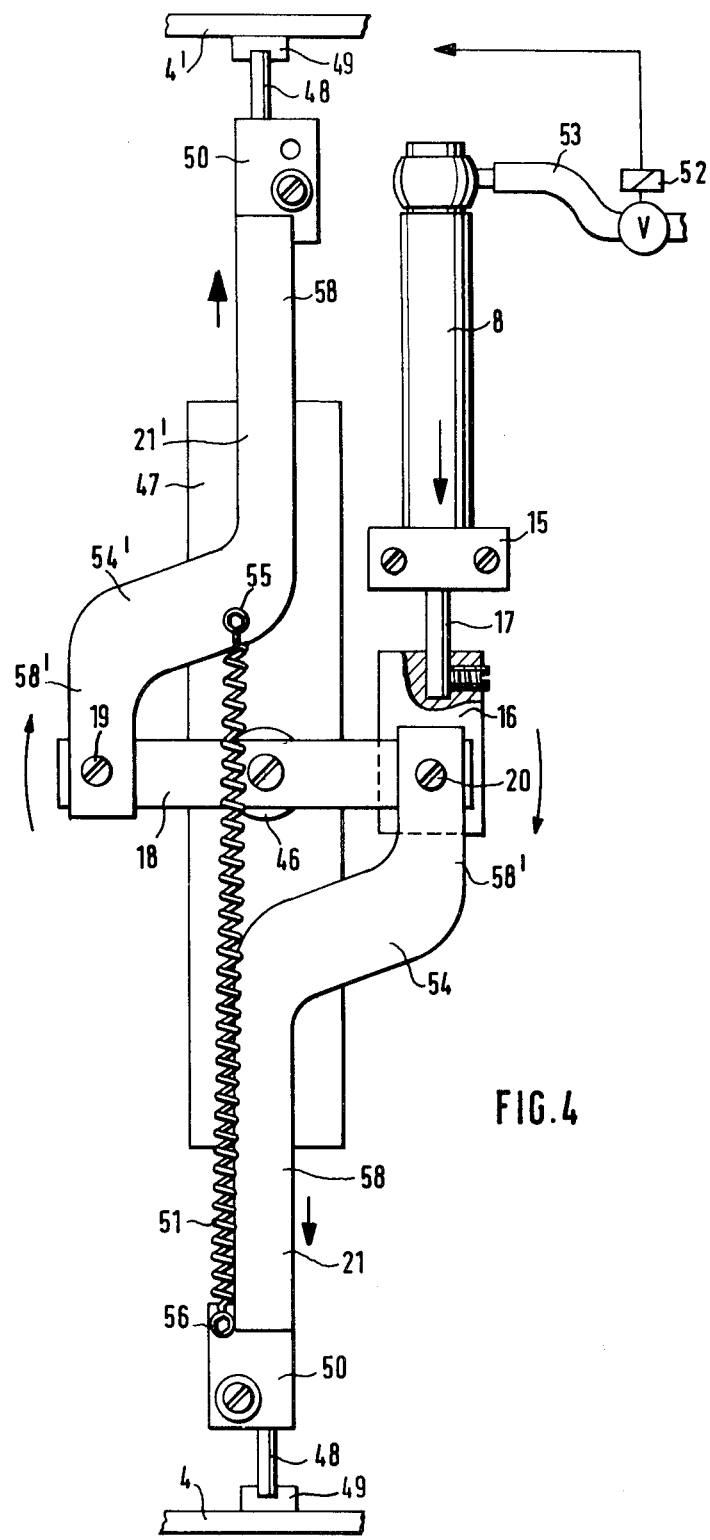
FIG. 4 is a plan view of a portion of the shifting mechanism according to FIG. 3.

As can be seen from FIG. 3, the two lifting cylinders 8 and the two pivoting levers 21, 21' of each rotary lever system, associated with a lifting cylinder, are located parallel to each other and symmetrically with respect to a center line M running perpendicularly to the roller rails 4, 4'. For the purpose of shifting the roller rails 4, 4' parallel to their starting or rest position, in which the rollers rest against the lateral edges of the printing plate 33, a slot 57 is provided in each connecting link 49.

Guide pins 14 (FIG. 2) are fastened on each roller rail 4, 4', and pass through the slots 26 in the guide parts 25. Whenever pressure is admitted to the lifting cylinders 8, the guide pins 14 then slide in the slots 26, as a result of the rotary movement of the rotary lever system which is connected to the lifting cylinders 8, and shift the roller rails 4, 4' parallel to themselves.

It is obvious to the person skilled in the art that it is also possible to provide more than two lifting cylinders 8 for shifting the roller rails 4, 4'.

What is claimed is:

1. A device for feeding and transporting printing forms onto an exposure table, comprising:
   a plurality of transport rollers located on each side of the exposure table for gripping the lateral edges of the printing forms, the transport rollers on each side being spaced apart in the direction of printing form transport to provide a first transport roller on each side and at least one subsequent transport roller on each side;
   means for selectively pivoting said first transport rollers outwardly from the edges of the printing form in response to feeding the leading edge of a printing form onto the exposure table, whereby jamming of the printing form against said first transport rollers is prevented;
   two rail members, one movably positioned on each side of the exposure table and extending parallel to each other in the direction of printing form transport, wherein said transport rollers are mounted on said rail members; and
   means, responsive to positioning of a printing form in an exposure position on the exposure table, for shifting said rail members outwardly in a direction perpendicular to the lateral edges of the printing form to move said transport rollers into positions spaced away from the lateral edges of the printing form, wherein said means for shifting said rail members comprises two lifting cylinders located beneath the exposure table and a rotary lever linkage system linking each cylinder to each of the rail members.

2. A device as claimed in claim 1, wherein each of lifting cylinders is installed in a retaining device on a stationary cast component of the exposure table.

3. A device as claimed in claim 1, wherein the rotary lever linkage system comprises a connecting piece connected to the piston rod of the lifting cylinder, a pivoting link member having two coupling points, two pivoting levers having one end each attached to one of said coupling points, a clamping piece attached to the other end of each pivoting lever, and rods attached to each clamping piece for connecting each pivoting lever to the rail member via a connecting link.

4. A device as claimed in claim 3, wherein the pivoting levers are mounted with the one end capable of rotation at said connecting point of the pivoting link member, and wherein said pivoting link member comprises a straight-line link member.

5. A device as claimed in claim 4, wherein the pivoting link member is guided, at its mid-point, in a central sleeve and can be pivoted about this sleeve, and wherein the central sleeve is installed on a central fixture.

6. A device as claimed in claim 4, wherein each pivoting lever comprises two parallel straight-line sections which are offset with respect to each other by the length of a connecting section, and wherein the connecting section is joined to the straight-line sections in an arcuate manner.

7. A device according to claim 3, wherein each rotary lever linkage system further comprises a return spring, one end of which is fastened to an attachment point on the one pivoting lever, and the other end of which is fastened to a further attachment point on the clamping piece of the other pivoting lever.

8. A device as claimed in claim 3, further comprising a guide member fixed to the exposure table, said guide member having a slot therein extending perpendicular to the direction of printing form transport, and a guide pin fastened on each rail member and passing through said slot.

9. A device as claimed in claim 1, wherein the lifting cylinders and the two pivoting levers of each associated rotary lever linkage system are located parallel to each other and symmetrically with respect to the center-line running perpendicularly to the rail members.

10. A device as claimed in claim 8, wherein the lifting cylinders are connected by a common pressure line in which a magnetic valve is located, said valve being controlled by signals from a signal transmitter responsive to positioning of a printing form in an exposure position on the exposure table.

11. A device as claimed in claim 3, wherein each rod can be shifted inside the attached clamping piece, and can be fixed in a manner such that the distance between the rail members can be matched to different printing form widths.

* * * * *